United States Patent [19]

Joo et al.

[11] Patent Number: 5,795,817
[45] Date of Patent: Aug. 18, 1998

US005795817A

[54] MOS TRANSISTOR ADOPTING TITANIUM-CARBON-NITRIDE GATE ELECTRODE AND MANUFACTURING METHOD THEREOF

[75] Inventors: Suk-ho Joo, Seoul; Choong-ryul Paik, Kyungki-do; Ki-hong Lee, Cheju-do, all of Rep. of Korea

[73] Assignee: Samsung Electronics Co., Ltd., Kyungki-do, Rep. of Korea

[21] Appl. No.: 619,361

[22] Filed: Mar. 21, 1996

[30] Foreign Application Priority Data

Mar. 30, 1995 [KR] Rep. of Korea ............. 95-7050

[51] Int. Cl.$^6$ ................................. H01L 21/28
[52] U.S. Cl. ............. 438/591; 438/592; 438/685
[58] Field of Search .................. 437/190, 192, 437/193; 438/591, 592, 685

[56] References Cited

U.S. PATENT DOCUMENTS

| | | | |
|---|---|---|---|
| 4,823,182 | 4/1989 | Okumura | 437/190 |
| 5,246,881 | 9/1993 | Sandhu et al. | 437/190 |
| 5,364,803 | 11/1994 | Lur et al. | 437/192 |
| 5,496,762 | 3/1996 | Sandhu et al. | 437/60 |
| 5,561,326 | 10/1996 | Ito et al. | 257/751 |
| 5,604,140 | 2/1997 | Byun | 437/192 |

*Primary Examiner*—John Niebling
*Assistant Examiner*—Thomas G. Bilodeau
*Attorney, Agent, or Firm*—Cushman Darby & Cushman Intellectual Property Group of Pillsbury Madison & Sutro LLP

[57] ABSTRACT

A MOS transistor employing a titanium-carbon-nitride (TiCN) gate electrode is provided. The MOS transistor has a gate insulating film, a gate electrode, and a source/drain region on a semiconductor substrate. The gate electrode is formed of a single TiCN film or a double film having a TiCN film and a low-resistant metal film formed thereon. The TiCN gate electrode exhibits a low resistance of about 80–100 μΩ-cm and can control variations in Fermi energy level.

5 Claims, 3 Drawing Sheets

1

MOS TRANSISTOR ADOPTING TITANIUM-CARBON-NITRIDE GATE ELECTRODE AND MANUFACTURING METHOD THEREOF

BACKGROUND OF THE INVENTION

The present invention relates to a metal-oxide semiconductor (MOS) transistor and a manufacturing method thereof, and more particularly, to a MOS transistor adopting a titanium-carbon-nitride (TiCN) gate electrode, and to a manufacturing method thereof.

A MOS transistor comprises a semiconductor substrate, source/drain regions formed by ion-implanting an impurity into the substrate, a channel region between the source/drain regions, and a gate formed over the channel region by intervening a gate insulating film. Here, the impurity type for the source/drain regions is opposite that for the substrate. Generally, the gate electrode of the MOS transistor is formed of N type impurity-doped polysilicon, which exhibits stable processing characteristics and high sheet resistance.

Meanwhile, in a PMOS transistor, which operates as a buried channel device, it is difficult to reduce threshold voltage without increasing short channel effects. As a way to overcome this problem, research efforts have concentrated on manufacturing a gate electrode from a metal material having a lower resistivity than polysilicon. Titanium nitride (TiN) has been especially suggested as a suitable gate electrode material.

Since a TiN gate electrode possesses a resistivity as low as 50 μΩ-cm or below, the RC delay time can be reduced. Another advantage is that the TiN gate electrode enables both an N-channel MOS transistor and a P-channel MOS transistor to operate as surface channel devices, since titanium nitride has the midgap energy level ($E_f$) of silicon. Hence, degradation of the transistor characteristics caused by short-channel effects can be prevented and process simplicity can be achieved.

In practice, however, the actually attained Fermi energy level of a fabricated TiN gate electrode deviates somewhat from the midgap energy level of silicon, according to the structure and chemical composition of the TiN film. This phenomenon will be described in connection with FIGS. 1 and 2.

FIG. 1 compares the capacitance-versus-voltage characteristics of a conventional MOS transistors employing a polysilicon gate electrode (plot a) and a TiN gate electrode (plot b). Here, it can be seen that the difference between the work functions of the TiN gate electrode and the polysilicon gate electrode is 0.6–0.7 eV. This indicates that the Fermi energy level of a TiN gate electrode shifts from the midgap energy level of silicon to the valance band.

FIGS. 2 and 3 are graphs showing the variation of threshold voltages depending on the gate length of conventional PMOS and NMOS transistors having the TiN gate electrodes, respectively. As the Fermi energy level of the TiN gate electrode shifts from the midgap energy level of silicon to the valance band thereof, its built-in potential increases, leading to an increase in the threshold voltage of the NMOS transistor and a decrease in that of the PMOS transistor.

As described above, the Fermi energy level of the TiN gate electrode deviates from the midgap energy level of silicon. This deviation creates a short channel, thereby deteriorating the characteristics of a transistor.

SUMMARY OF THE INVENTION

It is an object of the present invention to provide a MOS transistor for controlling variations of a work function.

2

It is another object of the present invention to provide a method for manufacturing the above MOS transistor.

To achieve the above object, there is provided a MOS transistor comprising a gate insulating film, a gate electrode, and a source/drain region on a semiconductor substrate, wherein the gate electrode is formed by either a TiCN film, or a low-resistant metal film atop a TiCN film.

Preferably, the low-resistant metal is selected from the group consisting of tungsten, tungsten silicide, titanium silicide, and copper.

To achieve another object, there is provided a method for manufacturing a MOS transistor, comprising the steps of: forming a gate insulating film on a semiconductor substrate; and forming a TiCN film for a gate electrode on the gate insulating film.

According to another aspect of the present invention, the TiCN film is formed by reactive sputtering, and the TiCN film is formed in an argon gas atmosphere at 600° C., using nitrogen and methane gases.

The MOS transistor manufacturing method further comprises the step of depositing a low-resistant metal material on the TiCN film after the TiCN film formation step. The low-resistant metal is selected from the group consisting of tungsten, tungsten silicide, titanium silicide, and copper.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
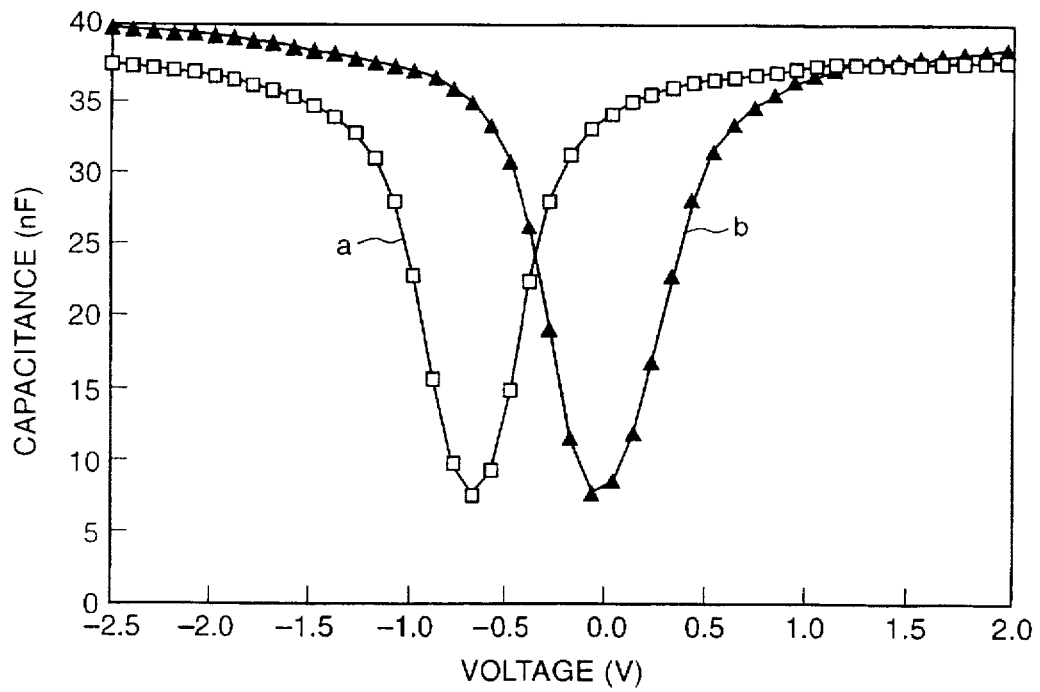
FIG. 1 is a graph showing the capacitance-versus-voltage characteristics of two conventional MOS transistors; one employing a TiN gate electrode and another employing a polysilicon gate electrode.
Figure 2:
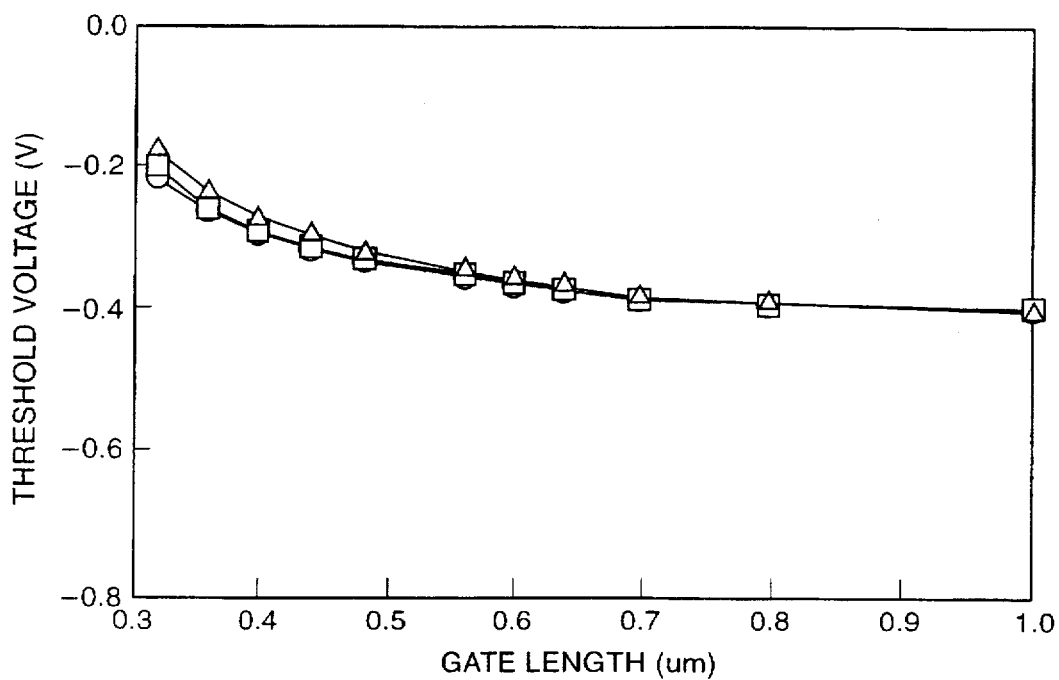
FIG. 2 is a graph showing the variation of threshold voltage with respect to gate length in a conventional PMOS transistor having a TiN gate electrode.
Figure 3:
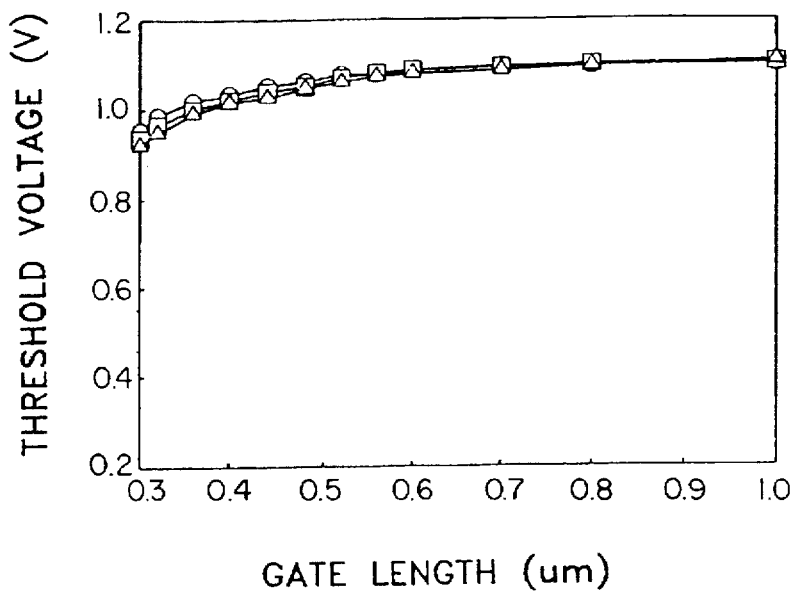
FIG. 3 is a graph showing the variation of threshold voltage with respect to gate length, in a conventional NMOS transistor having the TiN gate electrode.
Figure 4:
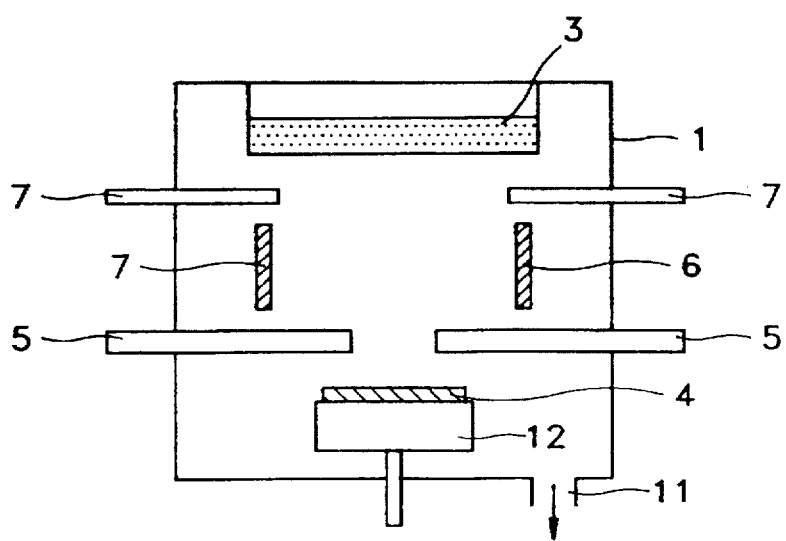
FIG. 4 is a schematic view of sputtering equipment for fabricating a MOS transistor having a TiCN gate electrode, according to the present invention.

In FIG. 4, titanium target 3 is disposed in the upper part of chamber 1, and a support 12 for supporting a wafer 4 and acting as a heater is provided, facing the titanium target 3. Nozzles 5 and 7 for injecting nitrogen and methane gases, and argon gas, respectively, are arranged at the upper and lower sides in the chamber 1. An outlet 11 is provided in the lower part of the chamber 1 to maintain a vacuum atmosphere. Shield 6 is provided between nozzles 5 and 7.

A method for forming a TiCN film in accordance with the present invention, using the sputtering equipment of FIG. 4 will now be described.

Sputtered titanium particles react with the nitrogen and methane gases, and argon gas supplied from nozzles 5 and 7 over wafer 4, thereby forming a TiCN film on a silicon substrate. Here, the nitrogen and methane gases are injected through the lateral annular nozzle 5, so that reaction takes place more actively on the silicon substrate. The TiCN is deposited to a thickness of 900 Å at a deposition temperature of 200° C., 400° C., or 600° C., with a pressure of 2 mTorr and a power of 4 kW, and a dose of the methane gas from 10 sccm to 20 sccm. During the process, 16 sccm of nitrogen and 10 sccm of argon are given.

Figure 5:
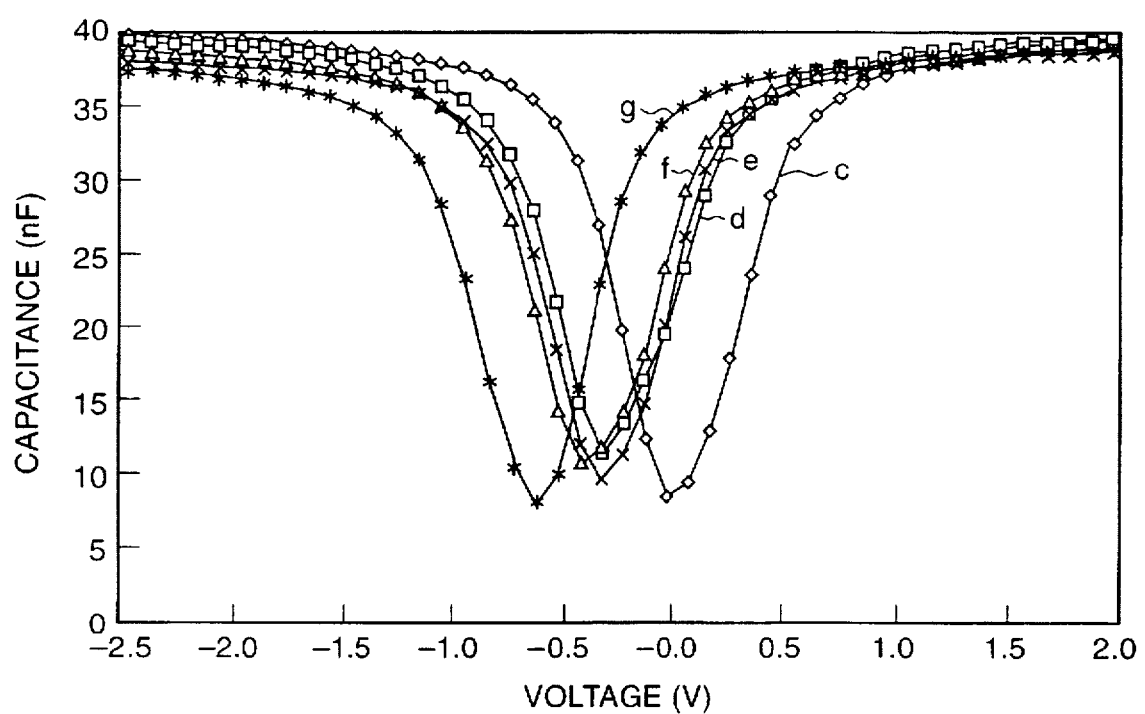
FIG. 5 is a graph for explaining the capacitance-versus-voltage characteristics of various MOS transistors having a TiCN gate electrode, according to the present invention.

The resistance of the TiCN film thus formed is observed to be very low, i.e., 80–100 µΩ-cm, and its C-V characteristic is illustrated in FIG. 5.

FIG. 5 is a graph for explaining the capacitance-versus-voltage characteristics of various MOS transistors having a TiCN gate electrode, according to the present invention. Here, plot c is for a conventional MOS transistor having a TiN gate electrode, plots d, e and f are for MOS transistors having TiCN gate electrodes with varying methane gas doses, i.e., 1 sccm, 3 sccm and 4 sccm, respectively, under the condition of 16 sccm of nitrogen gas, and plot g is for a conventional MOS transistor having a polysilicon gate electrode.

It is noted that, as the methane gas dose is increased, the above plots shift toward the polysilicon gate electrode. Thus, it can be concluded that the Fermi energy level of the TiCN gate electrodes have shifted toward the midgap energy level of silicon. Shifts of a flat band voltage depending on the methane gas dose from a plot having the polysilicon gate electrode are given below.

|  | methane gas dose (sccm) | | | |
| --- | --- | --- | --- | --- |
|  | 0 | 1 | 3 | 4 |
| flat band voltage shift (V) | 0.64 | 0.36 | 0.32 | 0.26 |

As shown in FIG. 5 and the above table, the Fermi energy level of the TiCN film can be adjusted by varying the dose of the methane gas.

In this embodiment, the gate electrode is formed of a single TiCN film, but it is an exemplary application only. Thus, a double film having a TiCN film and a low-resistant metal film of tungsten (W), tungsten silicide ($WSi_x$), titanium silicide ($TiSi_x$), or copper (Cu) can be used for the gate electrode.

S As described above, according to the present invention, the TiCN gate electrode formed by reactive sputtering exhibits a low resistance, i.e., 80–100 µΩ-cm. Further, adequate control of variations in the Fermi energy level, which occur in a TiN gate, is achieved by forming the TiCN gate electrode.

The present invention is not limited to the above embodiment of the present invention, and it should be clearly understood that many variations are possible within the scope and spirit of the present invention by anyone skilled in the art.

What is claimed is:

1. A method for manufacturing a MOS transistor, comprising the steps of:

forming a gate insulating film on a semiconductor substrate; and forming a TiCN film as a gate electrode on said gate insulating film.

2. A method for manufacturing a MOS transistor as claimed in claim 1, said TiCN film being formed by reactive sputtering.

3. A method for manufacturing a MOS transistor as claimed in claim 2, said TiCN film being formed in an argon gas atmosphere at 600° C., using nitrogen and methane gases.

4. A method for manufacturing a MOS transistor as claimed in claim 1, further comprising the step of depositing a metal material on said TiCN film, after said TiCN film formation step.

5. A method for manufacturing a MOS transistor as claimed in claim 4, said metal material being one selected from the group consisting of tungsten, tungsten silicide, titanium silicide, and copper.

* * * * *